US009253908B2

(12) United States Patent
Shinoda et al.

(10) Patent No.: US 9,253,908 B2
(45) Date of Patent: Feb. 2, 2016

(54) DEVICE MODULE

(71) Applicant: HOSIDEN CORPORATION, Yao-shi, Osaka (JP)

(72) Inventors: Koji Shinoda, Yao (JP); Takeshi Isoda, Yao (JP)

(73) Assignee: HOSIDEN CORPORATION, Yao-shi (JP)

( * ) Notice: Subject to any disclaimer, the term of this patent is extended or adjusted under 35 U.S.C. 154(b) by 101 days.

(21) Appl. No.: 13/760,329

(22) Filed: Feb. 6, 2013

(65) Prior Publication Data
US 2013/0208431 A1 Aug. 15, 2013

(30) Foreign Application Priority Data

Feb. 10, 2012 (JP) ................. 2012-027108

(51) Int. Cl.
*H05K 7/00* (2006.01)
*H05K 5/00* (2006.01)
*G06F 3/044* (2006.01)
(Continued)

(52) U.S. Cl.
CPC ................ *H05K 7/00* (2013.01); *G06F 1/1626* (2013.01); *G06F 3/041* (2013.01); *G06F 3/044* (2013.01); *H03K 17/962* (2013.01); *H05K 5/0017* (2013.01); *G06F 2203/04103* (2013.01);
(Continued)

(58) Field of Classification Search
CPC ...................... H01L 2224/48227; H05K 3/284; H05K 2203/1316; H05K 5/065; H05K 7/142; H05K 1/183; H05K 2201/10151; H05K 2201/10371; H05K 2201/10545; H05K 2201/09145; H05K 2201/10977; H05K 2203/1469; H05K 2203/175; H05K 3/0052; H05K 3/32; H05K 3/341; H05K 3/386; H05K 5/0017; H05K 5/003; H05K 5/0034; G06F 1/181; G06F 1/16; G06F 1/183
USPC ................ 361/679.01, 752, 679.02, 736, 56; 345/173, 156, 174
See application file for complete search history.

(56) References Cited

U.S. PATENT DOCUMENTS

| 8,736,001 B2 * | 5/2014 | Salatino et al. ............... 257/415 |
| 2002/0000979 A1 * | 1/2002 | Furuhashi et al. ............ 345/173 |

(Continued)

FOREIGN PATENT DOCUMENTS

| EP | 2395531 A1 | 12/2011 |
| JP | 2006-281601 A1 | 10/2006 |

(Continued)

OTHER PUBLICATIONS

Notification of Reasons for Refusal dated Sep. 24, 2013, in the counterpart Japanese patent application No. 2012-027108, with English translation.

(Continued)

*Primary Examiner* — Robert J Hoffberg
*Assistant Examiner* — Michael Matey
(74) *Attorney, Agent, or Firm* — Kratz, Quintos & Hanson, LLP

(57) ABSTRACT

The invention provides a device module including a device, a connecting part, and a plastic part. The device is a sensor, an electronic component, or a circuit board. The connecting part is connected to the device and includes an external connecting portion. The device and the connecting part are embedded in the plastic part. The plastic part is provided with a first opening that exposes at least the external connecting portion of the connecting part to the outside.

27 Claims, 8 Drawing Sheets

(51) Int. Cl.
*H03K 17/96* (2006.01)
*G06F 1/16* (2006.01)
*G06F 3/041* (2006.01)

(52) U.S. Cl.
CPC ............... *H03K2217/96031* (2013.01); *H03K 2217/960755* (2013.01); *H03K 2217/960785* (2013.01)

(56) References Cited

U.S. PATENT DOCUMENTS

| | | | |
|---|---|---|---|
| 2002/0149571 A1* | 10/2002 | Roberts | 345/174 |
| 2003/0141118 A1* | 7/2003 | Kakuno | 178/18.01 |
| 2003/0201985 A1* | 10/2003 | Katakami | 345/173 |
| 2005/0110772 A1* | 5/2005 | Kong et al. | 345/174 |
| 2007/0218957 A1* | 9/2007 | Nishikawa et al. | 455/566 |
| 2008/0122793 A1* | 5/2008 | Watanabe et al. | 345/173 |
| 2009/0108985 A1 | 4/2009 | Haag et al. | |
| 2009/0315856 A1* | 12/2009 | Oikawa et al. | 345/174 |
| 2010/0201649 A1 | 8/2010 | Kai et al. | |
| 2010/0273539 A1* | 10/2010 | Lee et al. | 455/575.3 |
| 2011/0255850 A1* | 10/2011 | Dinh et al. | 396/176 |
| 2012/0135247 A1* | 5/2012 | Lee et al. | 428/426 |
| 2012/0262006 A1* | 10/2012 | Elberbaum | 307/112 |
| 2012/0307461 A1* | 12/2012 | Liskow | 361/749 |

FOREIGN PATENT DOCUMENTS

| | | |
|---|---|---|
| JP | 2009-238661 A1 | 10/2009 |
| JP | 2010-113373 A | 5/2010 |
| JP | 2011-216129 A | 10/2011 |
| JP | 2012-011691 A | 1/2012 |
| WO | 2009014020 A1 | 1/2009 |
| WO | 2009/035038 A1 | 3/2009 |

OTHER PUBLICATIONS

Notification of Reasons for Refusal dated Apr. 22, 2014 issued in counterpart application No. 2012-027108 with English translation.
Notification of Reasons for Refusal dated Dec. 9, 2014 for the counterpart Japanese application No. 2012-027108 with English Translation.
Extended European Search Report for the Corresponding EP Application No. 13250014.1, mailed on Mar. 25, 2015.

* cited by examiner

DEVICE MODULE

The present application claims priority under 35 U.S.C. §119 of Japanese Patent Application No. 2012-27108 filed on Feb. 10, 2012, the disclosure of which is expressly incorporated by reference herein in its entity.

BACKGROUND OF THE INVENTION

1. Technical Field

The invention relates to device modules.

2. Background Art

There is a known device module including an ornamental panel as disclosed in Japanese Unexamined Patent Application Publication No. 2006-281601 and a sensor such as a touch panel. The ornamental panel includes a transparent sheet that is touchable by an object to be detected such as a finger, a plastic part disposed on the sheet, and an ornamental layer provided between the sheet and the plastic part. The sensor is fixed to a back face of the plastic part.

SUMMARY OF INVENTION

The known device module is provided on the back face of plastic part with ribbed parts for attaching the ornamental panel to electronic equipment. Unfortunately, the ribbed parts interfere with attaching the sensor to the back face of the plastic part, which may lead to poor yield rate of the device module.

In view of the above circumstances, the invention is devised to provide an improved device module in terms of its yield rate.

A device module in accordance with an aspect of the invention includes a device, a connecting part, and a plastic part. The device is a sensor, an electronic component, or a circuit board. The connecting part is connected to the device and includes an external connecting portion. The device and the connecting part are embedded in the plastic part. The plastic part is provided with a first opening that exposes at least the external connecting portion of the connecting part to the outside. This aspect of the invention makes it possible to obviate a step of fixing the device to the plastic part because the device is embedded in the plastic part. This should lead to increased yield rate of the device module. Moreover, the device embedded in the plastic part is connected to the connecting part, and the external connecting portion of the connecting part is exposed from the first opening of the plastic part. Such external connecting portion facilitates external connection of the device.

The connecting part may include a first end serving as the external connecting portion. This aspect of the invention facilitates the connection of the first end of the connecting part to the outside because the first end is exposed from the first opening of the plastic part.

Alternatively, the connecting part may includes a first end exposed from the first opening. A tip of the first end may be embedded in the plastic part. This aspect of the invention makes it possible to prevent the first end from moving due to external impacting force because the tip of the first end is embedded in the plastic part. It is therefore possible to reduce the risk of unstable external connection of the first end or the external connecting portion due to the movement of the first end.

The device module may further include an engaging part. The engaging part may be partially embedded in the plastic part, partially exposed from the first opening of the plastic part, and engaged with the connecting part. In this aspect of the invention, the engaging part engaged with the connecting part can restrict movement of the part of the connecting part protruding from the first opening when insert-molding or otherwise embedding the device and the connecting part in the plastic part. It is thus possible to improve the operating efficiency in embedding the device and the connecting part in the plastic part. Further, the first opening is provided in the plastic part such that the engaging part is exposed from the plastic part. That is, the engaging part is embedded below the first opening of the plastic part. It is therefore possible to compensate reduction in strength of the plastic part due to its reduced thickness by providing the first opening.

The device module may further include a sheet. The plastic part may be provided on the sheet.

The engaging part embedded in the plastic part may be in contact with the sheet. The first opening may be provided on an opposite side of the engaging part from the sheet so as to expose the engaging part partially. Generally speaking, in the case where a sheet has flexibility when molding the plastic part, providing an opening in the plastic part tends to cause the sheet to have a sink mark at a portion exposed from the opening. However, in this aspect of the invention, the engaging part in contact with the sheet is embedded in the plastic part. Since the first opening exposes the engaging part partially on the opposite side from the sheet, the sheet is less likely to have a sink mark.

Alternatively, the device module may further include a sheet and a reinforcing part. The plastic part may be disposed on the sheet. The reinforcing part may be fixed to the first end of the connecting part. The reinforcing part as contacting the sheet may be embedded in the plastic part. Generally speaking, in the case where a sheet has flexibility when molding the plastic part, providing an opening in the plastic part tends to cause the sheet to have a sink mark at a portion exposed from the opening. However, in this aspect of the invention, the reinforcing part as contacting the sheet is embedded in the plastic part. Since the first opening exposes the first end of the connecting part fixed to the reinforcing part, the sheet is less likely to have a sink mark.

At least one of the sheet and the plastic part may have translucency.

All edges of the engaging part or the reinforcing part on the side of the sheet may be in curved form. In this aspect of the invention, the outer shape of the engaging part or the reinforcing part hardly causes irregularities on the flexible sheet when forming the plastic part.

The reinforcing part may have elasticity. This aspect of the invention makes it possible to improve the adhesiveness of the reinforcing part by bringing the flexible reinforcing part into contact with the sheet. Accordingly, the reinforcing part in contact with the sheet can be embedded in the plastic part with reduced possibility of leaks of some plastic material from between the reinforcing part and the sheet. Therefore, this aspect of the invention can reduce the risk that plastic burrs are formed in the vicinity of the first end of the connecting part and/or the first opening of the plastic part, and the risk that the external connecting portion is buried in the plastic material.

The device module may further include a spacer. The spacer and the device may be embedded in the plastic part, with the spacer disposed on the sheet and the device disposed on the spacer. The device, if provided on a flexible sheet, may cause irregularities of the sheet when molding the plastic part because functional requirements of the device restrict modification of the outer shape and/or material of the device. However, in this aspect of the invention, the spacer is disposed on the sheet and the device is disposed on the spacer. There is little restriction in the outer shape and/or material of the spacer, unlike the device, so that it is possible to select the outer shape and/or material of the spacer so as to hardly cause irregularities on the flexible sheet due to the outer shape of the spacer when molding the plastic part. For example, all of the edges of the spacer on the side of the sheet may be in curved form, or the spacer may be made of material in the same group as that of the material for the sheet, or it may be of an elastic material.

The plastic part may further include a second opening provided on an opposite side of the device from the sheet. In this aspect of the invention, the plastic part provided with the second opening can be fabricated with reduced amount of plastic material, leading to reduced cost of the device module. Moreover, as the device is embedded below the second opening of the plastic part, it is possible to compensate reduction in strength of the plastic part due to reduced thickness of the plastic part by providing the second opening.

At least one of the sheet, the plastic part, and spacer may have translucency.

If the sheet has translucency, the device module may further include an ornamental layer interposed between the sheet and the plastic part.

A first manufacturing method of the device module of the invention is as follows. First, prepared is the device (a sensor, an electronic component, or a circuit board), to which the connecting part is connected. Also prepared is the engaging part engaged with the connecting part or the reinforcing part fixed to the connecting part. The device is then fixed to a first mold, while the engaging part or reinforcing part is fixed to the first mold or a second mold. The first and second molds are then combined with each other, thereby brining a convex portion of the second or first mold into abutment with the engaging part or connecting part. Plastic is poured into the first and second molds, and the first and second molds are removed later.

The first or second mold may have a movable part that can be nested and function as the convex portion. In this case, the movable part may be brought into contact with the engaging part or connecting part after combining the first and second molds.

A second manufacturing method of the device module of the invention is as follows. First, prepared is the device (a sensor, an electronic component, or a circuit board), to which the connecting part is connected. Also prepared is the engaging part engaged with the connecting part or the reinforcing part fixed to the connecting part. After that, the device and the engaging part, or the device and the reinforcing part are fixed to the sheet. The sheet is then fixed to a first mold. After that, the first mold is combined a second mold, thereby brining a convex portion of the second mold into contact with the engaging part or connecting part. Plastic is poured into the first and second molds, and the first and second molds are removed later.

The second mold may have a movable part that can be nested and functions as the convex portion. In this case, the movable part may be brought into contact with the engaging part or connecting part after combining the first and second molds.

A third manufacturing method of the device module of the invention is as follows. First, prepared is the device (a sensor, an electronic component, or a circuit board), to which the connecting part is connected. Also prepared is the engaging part engaged with the connecting part or the reinforcing part fixed to the connecting part. After that, one of the device and the engaging part, or one of the device and the reinforcing part is fixed to the sheet. The sheet is then fixed to a first mold, while the other one of the device and the engaging part, or the other one of the device and the reinforcing part is fixed to a second mold. Then, the first and second molds are combined with each other, thereby brining a convex portion of the first or second mold into contact with the engaging part or connecting part. Plastic is poured into the first and second molds, and the first and second molds are removed later.

The first or second mold may have a movable part that can be nested and functions as the convex portion. In this case, the movable part may be brought into contact with the engaging part or connecting part after combining the first and second molds.

Instead of fixing the device to the sheet, the spacer may be fixed onto the sheet, and the device may be fixed onto the spacer.

DESCRIPTION OF EMBODIMENTS

Figure 1A:
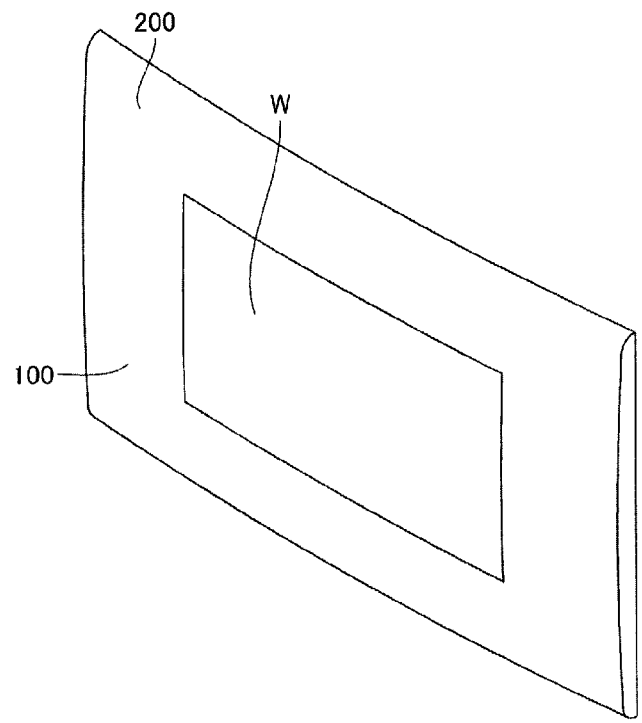
FIG. 1A is a front, top, and right side schematic perspective view of a device module in accordance with the First embodiment of the invention.

First to Sixth embodiments of the invention will be described below by way of example.

First Embodiment

First, a device module in accordance with the First embodiment will be described with reference to FIG. 1A to FIG. 2B.

The device module shown in FIG. 1A to FIG. 2B is a touch sensing device. The device module includes a sheet 100, an ornamental layer 200, a plastic part 300, a touch sensor 400 (corresponding to the device in the claims), a connecting part 500, and a reinforcing part 600. These constituents of the device module will be described below in detail.

Figure 1B:
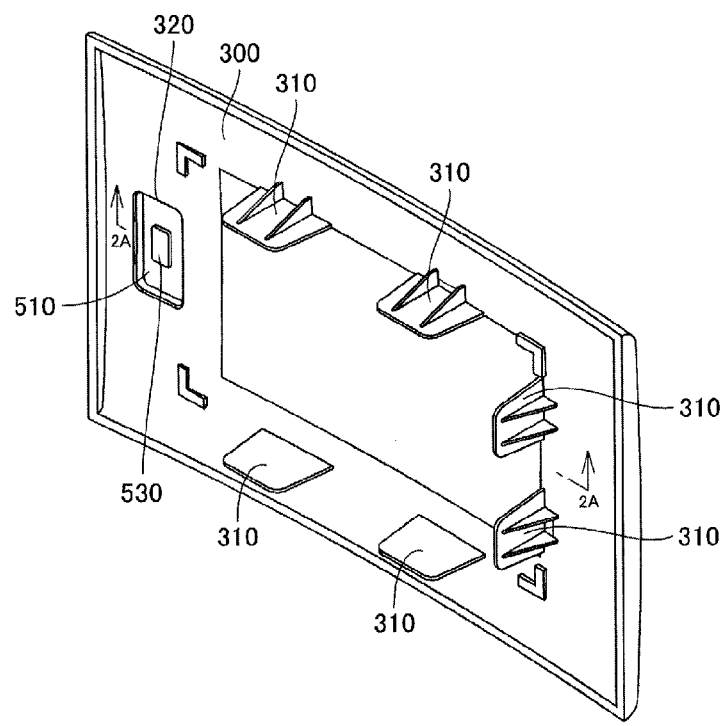
FIG. 1B is a rear, top and left side schematic perspective view of the device module.
Figure 2A:
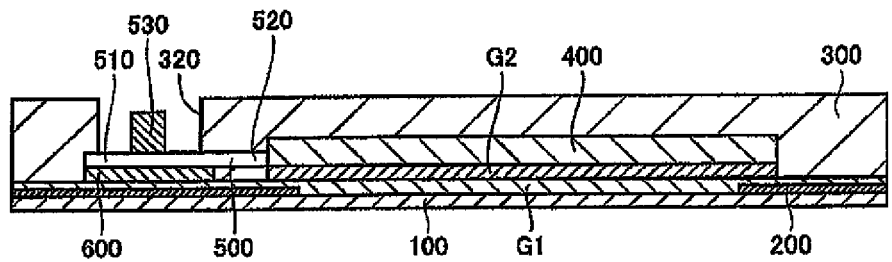
FIG. 2A is a schematic partial end view of the device module taken along line 2A-2A in FIG. 1B.
Figure 2B:
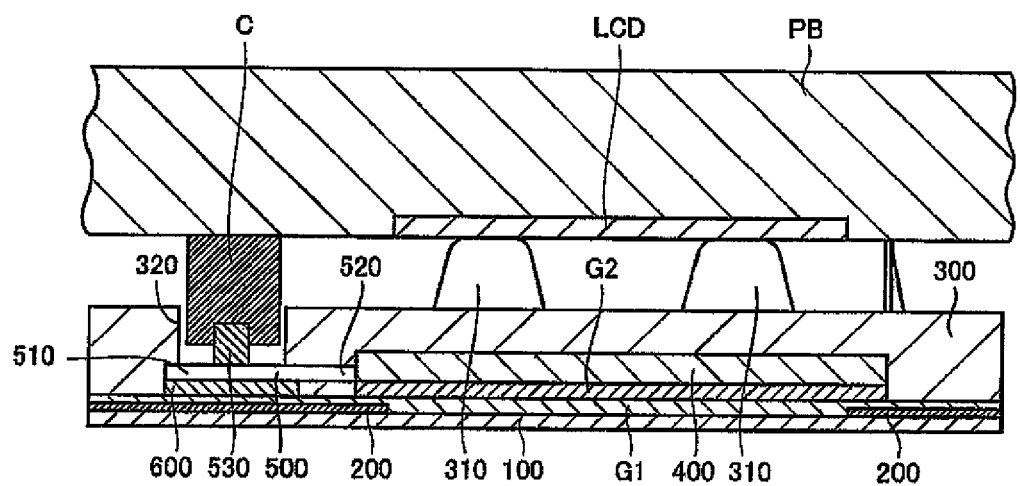
FIG. 2B is a schematic partial sectional view of the device module taken along line 2A-2A in FIG. 1B as attached to a circuit board of electronic equipment.

The sheet 100 is a substantially rectangular flexible film of optically transparent resin such as PET (polyethylene terephthalate) and acrylic resin. The sheet 100 has an outer face and an inner face (the lower and upper faces in FIG. 2A and FIG. 2B). As shown in FIG. 1A and FIG. 1B, the periphery of the inner face of the sheet 100 is subjected to ornamental printing (e.g. painted in black) in a frame shape to form the ornamental layer 200. The ornamental layer 200 defines a rectangular transparent window W in the center of the sheet 100 as shown in FIG. 1A. The transparent window W on the outer face of the sheet 100 serves as a touch sensing surface. As shown in FIG. 2A and FIG. 2B, a bonding layer G1 is applied to the inner face of the sheet 100 and the ornamental layer 200.

The touch sensor 400 is a capacitive touch panel of substantially rectangular shape and in rigid or flexible and optically transparent sheet form to detect a detection object such as a finger that touches the touch sensing surface. The touch sensor 400 is fixed to the inner face of the transparent window W of the sheet 100 and an inner periphery of the ornamental layer 200 via the bonding layer G1 and an adhesive layer G2 (that is, the touch sensor 400 is laid on the transparent window W of the sheet 100 and the inner periphery of the ornamental layer 200). The touch sensor 400 extends substantially parallel to the outer face of the sheet 100, maintaining a constant distance between the touch sensor 400 and the outer face of the sheet 100 (the touch sensing surface).

If the touch sensor 400 is in a rigid transparent sheet form, it may have any one of the configurations (1) to (3) indicated below. If the touch sensor 400 is in a flexible transparent sheet form, it may have any one of the configurations (4) to (6) indicated below.

1) The touch sensor 400 includes a first transparent substrate having first and second faces in its thickness direction, a plurality of first transparent electrodes provided on the first face of the first transparent substrate, and a plurality of second transparent electrodes provided on the second face of the first transparent substrate.

2) The touch sensor 400 includes a first transparent substrate, a plurality of first transparent electrodes provided on the first transparent substrate, an insulating layer provided on the first transparent substrate so as to cover the first transparent electrodes, and a plurality of second transparent electrodes provided on the insulating layer.

3) The touch sensor 400 includes a first transparent substrate having a first face, a second transparent substrate having a first face opposed to the first face of the first transparent substrate, a plurality of first transparent electrodes provided on the first face of the first transparent substrate, and a plurality of second transparent electrodes provided on the first face of the second transparent substrate.

4) The touch sensor 400 includes a flexible insulating first transparent film having first and second faces in its thickness direction, a plurality of first transparent electrodes provided on the first face of the first transparent film, and a plurality of second transparent electrodes provided on the second face of the first transparent film.

5) The touch sensor 400 includes a flexible insulating first transparent film, a plurality of first transparent electrodes provided on the first transparent film, a flexible insulating second transparent film provided on the first transparent film so as to cover the first transparent electrodes, and a plurality of second transparent electrodes provided on the second transparent film.

6) The touch sensor 400 includes a flexible insulating first transparent film having a first face, a flexible insulating second transparent film having a first face opposed to the first face of the first transparent film, a plurality of first transparent electrodes provided on the first face of the first transparent film, and a plurality of second transparent electrodes provided on the first face of the second transparent film.

It should be appreciated that the sheet 100 may be used as the first transparent film. In the case where the sheet 100 has no flexibility, it may be used as the first transparent substrate.

The connecting part 500 has flexibility. Specifically, the connecting part 500 is a flexible printed circuit board (PCB) (see FIG. 2A and FIG. 2B) or a flexible insulating transparent film. The connecting part 500 has lengthwise opposite ends, namely a first end 510 and a second end 520, and an external connecting portion 530. If the connecting part 500 is a flexible PCB, the second end 520 is connected to at least one of the first and second transparent substrates or of the first and second transparent films of the touch sensor 400, and the flexible PCB has a plurality of conducting lines connected to the first and second transparent electrodes. If the connecting part 500 is a flexible insulating transparent film, the second end 520 is connected to at least one of the first and second transparent substrates or of the first and second transparent films of the touch sensor 400, and the transparent film has a plurality of conducting lines connected to the first and second transparent electrodes. The external connecting portion 530 is provided on the first end 510 of the connecting part 500. The external connecting portion 530 is a connector connectable to a B-to-B (board-to-board) connector C on a circuit board PB of the electronic equipment for installing the device module.

The reinforcing part 600 is a substantially plate formed of insulating plastic, elastomer, adhesive such as hot-melt adhesive and OCA (Optically Clear Adhesive), a double-faced adhesive tape, or metal such as Steel Use Stainless (SUS). As shown in FIG. 2A and FIG. 2B, the reinforcing part 600 is fixed to a face of the first end 510 of the connecting part 500 facing the sheet 100. The bonding layer G1 serves to fix the reinforcing part 600 to the inner face of the sheet 100. More particularly, the reinforcing part 600 is in contact with the inner face of the sheet 100 via the ornamental layer 200.

The plastic part 300 is substantially rectangular part made of insulating thermosoftening or thermosetting plastic. The plastic part 300 is provided on the inner face of the sheet 100 and the ornamental layer 200. The sheet 100 is generally in intimate contact with or integrated into the plastic part 300 and has hardened (i.e. has lost its flexibility). The plastic part 300 maintains the touch sensing surface of the flexible sheet 100 in a flat state. Embedded in the plastic part 300 are the touch sensor 400, the second end 520 of the connecting part 500, the tip of the first end 510 of the connecting part 500, and the reinforcing part 600. The plastic part 300 has a substantially rectangular central area, corresponding to the transparent window W of the sheet 100, and a peripheral area around the central area. The back face of the plastic part 300 is provided with a plurality of ribbed parts 310 surrounding the central area in a lateral U-shape arrangement as shown in FIG. 1B. The ribbed parts 310 can be fixed to a housing or the circuit board PB (see FIG. 2B) of the electronic equipment. The plastic part 300 (with its ribbed parts 310 fixed to the housing or the circuit board PB of the electronic equipment), the ornamental layer 200, and the sheet 100 constitute the ornamental panel of the electronic equipment. A rectangular first opening 320 is formed in an end (the left end in FIG. 2A and FIG. 2B) of the peripheral area of the plastic part 300. The opening 320 exposes the first end 510 (excluding its tip) of the connecting part 500 and the external connecting portion 530 to the outside of the plastic part 300.

The device module configured as described above may be manufactured in the following steps. First, the sheet 100 is prepared. The periphery of the inner face of the sheet 100 is subjected to ornamental printing such as gravure printing to form the ornamental layer 200. After that, the bonding layer G1 is applied or formed in any other process on the inner face of the sheet 100 and the ornamental layer 200.

Also prepared are the touch sensor 400, with the connecting part 500 connected thereto, and the reinforcing part 600. The reinforcing part 600 is fixed to the first end 510 of the connecting part 500. Then, the adhesive layer G2 is applied or formed in any other process on the touch sensor 400. After that, the touch sensor 400 is placed on and along the inner face of the sheet 100 and the ornamental layer 200. At the same time, the reinforcing part 600 is mounted at a predetermined position (the position corresponding to the first opening 320 of the plastic part 300) on the ornamental layer 200. As a result, the touch sensor 400 is fixed to the inner face of the sheet 100 and the ornamental layer 200 with the bonding layer G1 and the adhesive layer G2. The engaging part 600 is also fixed to the ornamental layer 200 with the bonding layer G1.

After that, the sheet 100 with the ornamental layer 200, the touch sensor 400, the connecting part 500, and the reinforcing part 600 are placed in a first mold (not shown), onto which the outer face of the sheet 100 is fixed. Then, the first mold is combined with a second mold (not shown). Then, a convex portion of the second mold comes into contact with the first end 510 of the connecting part 500, and the external connecting portion 530 on the first end 510 is received in a hole formed in the convex portion. In this state, thermosoftening or thermosetting plastic is poured into the first and second molds to insert mold the touch sensor 400, the second end 520 of the connecting part 500, the tip of the first end 510 of the connecting part 500, and the reinforcing part 600 in the thermosoftening or thermosetting plastic. The hardened thermosoftening or thermosetting plastic forms the plastic part 300. Thus embedded by insert molding in the plastic part 300 are: the touch sensor 400 as placed on and in contact with the sheet 100, the second end 520 of the connecting part 500 as connected to the touch sensor 400, the tip of the first end 510 of the connecting part 500, and the reinforcing part 600 together with the connecting part 500. This insert molding process also forms the first opening 320 of the plastic part 300, conforming to the convex portion of the second mold, and the plurality of ribbed parts 310 of the plastic part 300 from the thermosoftening or thermosetting plastic entered in a plurality of recesses of the second mold. The sheet 100 is brought into close contact with or integrated with the plastic part 300, and it hardens. After that, the first and second molds are removed. Then, a part of the first end 510 of the connecting part 500 and the external connecting portion 530 are exposed from the first opening 320.

The device module thus manufactured may be installed in an electronic equipment in the following manner. First, the external connecting portion 530 of the connecting part 500 is connected to the connector C on the circuit board PB of the electronic equipment, and the device module is fixed to the circuit board PB of the electronic equipment with a screw or other means as shown in FIG. 2B. Simultaneously, the ribbed parts 310 are engaged with the housing or the circuit board PB of the electronic equipment. The device module is thus mounted on the electronic equipment. The circuit board PB of the electronic equipment may or may not have an LCD (Liquid Crystal Display) mounted thereon. In the former case, when the device module is fixed to the housing or the circuit board PB, the LCD is located on the back side of the central area of the plastic part 300. That is, the LCD is visually recognizable from the outside through the central area of the plastic part 300, the touch sensor 400, and the transparent window W of the sheet 100.

The device module of this embodiment has many technical features. Firstly, as the touch sensor 400 is insert-molded in the plastic part 300, it is possible to omit a step of fixing the touch sensor 400 to the plastic part 300. This should increase the yield rate of the device module.

Secondly, since the external connecting portion 530 of the connecting part 500 is exposed from the first opening 320 of the plastic part 300, the external connecting portion 530 can be easily connected to the circuit board PB. It is also easy to stabilize the connection of the device module for the following reason. The connecting part 500 has flexibility, but the second end 520 and the tip of the first end 510 are embedded in the plastic part 300. Therefore, even when external impacting force is applied to the first end 510 and the external connecting portion 530 thereon with the external connecting portion 530 connected to the electronic equipment, the first end 510 will be unlikely to move in such a manner as to disconnect the external connecting portion 530 from the electronic equipment. Therefore, it is possible to improve the connection stability of the device module.

Generally speaking, in the case where a sheet has flexibility when molding the plastic part, providing an opening in the plastic part tends to cause the sheet to have a sink mark at a portion exposed from the opening, cause light leaks from the opening of the plastic part, and/or cause the plastic part to decrease in strength due to its reduced thickness. However, in the present device module, the reinforcing part 600 in contact with the sheet 100 is embedded below the first opening 320 of the plastic part 300 (on the side of the sheet). Therefore, the sheet 100 is less likely to have a sink mark when molding the plastic part 300, and the plastic part 300 is less likely to suffer from light leaks from its first opening 320 or decreased strength due to its reduced thickness.

Further, the touch sensor 400 as disposed on the inner face of the sheet 100 is embedded in the plastic part 300 by insert molding, reducing the distance between the outer face (the touch sensing face) of the sheet 100 and the touch sensor 400. It is therefore possible to improve the sensitivity of the touch sensor 400. Still further, the touch sensor 400 embedded in the plastic part 300 can be disposed at a large distance from the LCD that may be disposed on the back side of the touch sensor 400. It is therefore possible to omit a shield between the LCD and the touch sensor 400 for shielding noise from the LCD.

Second Embodiment

Figure 3:
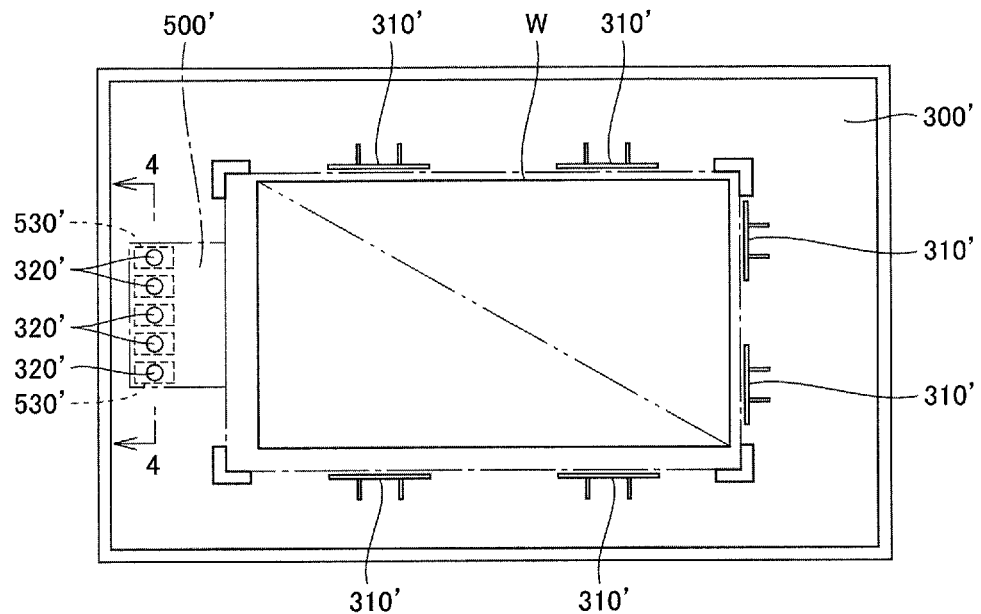
FIG. 3 is a schematic rear view of the device module in accordance with the Second embodiment of the invention.
Figure 4:
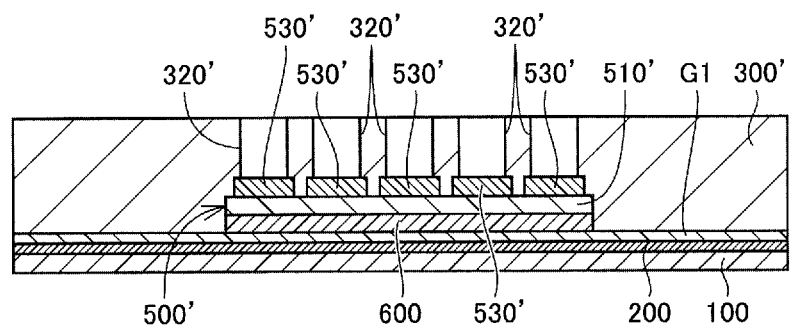
FIG. 4 is a schematic partial end view of the device module taken along line 4-4 in FIG. 3.

Next, a device module in accordance with Second embodiment will be described with reference to FIG. 3 and FIG. 4. The device module shown in FIG. 3 has substantially the same configuration as that of the First embodiment and differs only in having a plurality of external connecting portions 530' on a first end 510' of a connecting part 500', and a plurality of first openings 320' to expose only the external connecting portions 530' from the plastic part 300'. Only these differences will be described below in detail, and redundant description will be omitted. A symbol _'_ is added to the reference numerals of the plastic part and the connecting part and their subcomponents to distinguish them from those of the First embodiment.

The external connecting portions 530', which may be contacts or electrodes, are provided on the first end 510' of the connecting part 500'. The plurality of first openings 320' are columnar and formed in the plastic part 300'. The first openings 320' exposes only the associated external connecting portions 530' to the outside.

The device module configured as described above may be manufactured in the following steps. The manufacturing steps are the same as those in the First embodiment until the touch sensor 400 is attached to the inner face of the sheet 100 and the ornamental layer 200 and the reinforcing part 600 is attached to the ornamental layer 200.

The next step is to place the sheet 100 with the ornamental layer 200, the touch sensor 400, the connecting part 500', and the reinforcing part 600 in a first mold (not shown) and fix the outer face of the sheet 100 to the first mold. The first mold is then combined with a second mold (not shown). Then, a plurality of convex portions of the second mold comes into contact with the plurality of external connecting portions 530' on the first end 510' of the connecting part 500'. In this state, thermosoftening or thermosetting plastic is poured into the first and second molds to insert mold the touch sensor 400, the second end 520' of the connecting part 500', the tip of the first end 510' of the connecting part 500', and the reinforcing part 600 in the thermoplastic or thermosetting plastic. The hardened thermoplastic or thermosetting plastic forms the plastic part 300'. This insert molding process also forms the plurality of first openings 320' in the plastic part 300', conforming to the convex portions of the second mold. The rest are the same as in the First embodiment. After that, the first and second molds are removed. As a result, the external connecting portions 530' of the connecting part 500' are partly exposed from the respective first openings 320' of the plastic part 300'.

The device module thus manufactured is fixed to a circuit board of electronic equipment with a screw or other means as in the First embodiment. Simultaneously, the ribbed parts 310' are engaged with the housing or the circuit board of the electronic equipment. The device module is thus mounted on the electronic equipment. Also, the external connecting portions 530' of the connecting part 500' are brought into contact with contacts on the circuit board of the electronic equipment. Consequently, the connecting part 500' is connected to the circuit board.

The above device module produces effects similar to those in the First embodiment. Moreover, when the device module is mounted on the electronic equipment, the external connecting portions 530' (contacts or electrodes) exposed from the first openings 320' of the plastic part 300' are brought into contact with and thereby connected to the contacts of the board of the electronic equipment. It is therefore possible to establish the external connection of the device module. Further, since the connecting part 500' other than the external connecting portions 530' is embedded in the plastic part 300', external impacting force will not cause the connecting part 500' to move in such a manner as to disconnect the external connecting portions 530' from the electronic equipment. It is therefore possible to stabilize the connection of the device module.

Third Embodiment

Figure 5A:
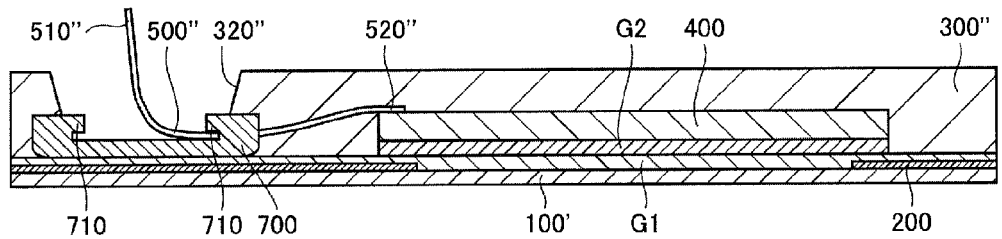
FIG. 5A is a schematic partial end view of a device module in accordance with the Third embodiment of the invention.
Figure 5B:
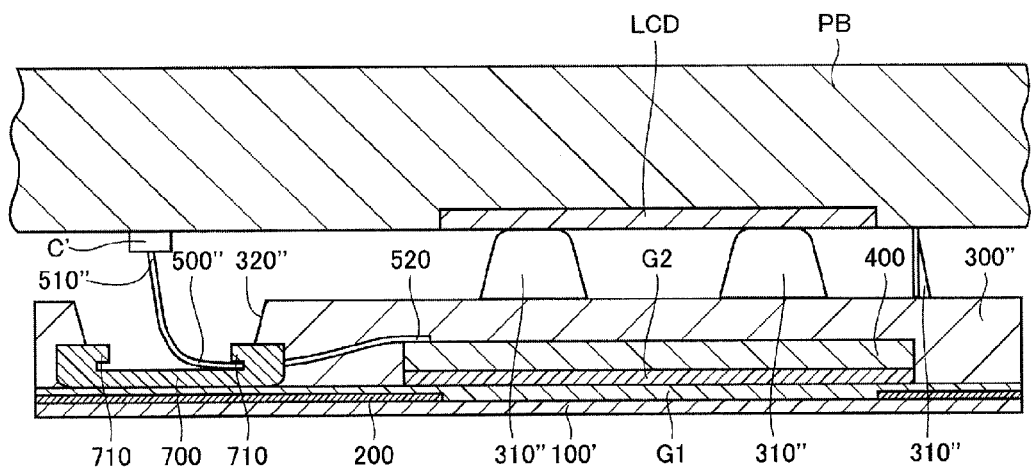
FIG. 5B is a schematic partial sectional view of the device module as attached to a circuit board of electronic equipment.

A device module in accordance with the Third embodiment will be described with reference to FIG. 5A and FIG. 5B. The device module shown in FIG. 5A and FIG. 5B has substantially the same configuration as the device module of the First embodiment and differs only in having an engaging part 700 in place of the reinforcing part 600, a first end 510" of a connecting part 500" serving as an external connecting portion, and an about half of the connecting part 500' on the first end 510" side led out from a first opening 320" of a plastic part 300". Only these differences will be described below in detail, and redundant description will be omitted. A symbol _"_ is added to the reference numerals of the plastic part and the connecting part and their subcomponents to distinguish them from those of the First embodiment. A symbol _'_ is added to the reference numeral of the sheet to distinguish it from that of the First embodiment.

The engaging part 700 is a block having a substantially U-shaped cross section. It may be made of insulating resin, elastomer, adhesive such as hot-melt adhesive and OCA (Optically Clear Adhesive), or a double-faced tape. The engaging part 700 is fixed to the sheet 100' with the bonding layer G1, in contact with the inner face of the sheet 100' via the ornamental layer 200. At least one of the longitudinal ends of the engaging part 700 has a receiving hole (not shown) to receive the connecting part 500". An engaging piece 710 projects inward from each longitudinal distal end of the engaging part 700. One of the engaging pieces 710 is engaged with the connecting part 500" passed through the receiving hole. The longitudinal ends and the widthwise ends of the engaging part 700 have edges in curved form on the side of the sheet 100'. The curved edges prevent the outer shape of the engaging part 700 appearing as irregularities on the outer face of the flexible sheet 100' when forming the plastic part 300".

Embedded in the plastic part 300" are the touch sensor 400, an about half of the connecting part 500" on the second end 520" side, and the longitudinal and widthwise ends of the engaging part 700 (that is, the periphery of the engaging part 700). The central area inside the periphery of the engaging part 700 and the about half of the connecting part 500' on the first end 510" side are exposed from the first opening 320" to the outside of the plastic part 300".

The device module configured as described above may be manufactured in the following steps. The first step is to prepare the sheet 100' with the ornamental layer 200 formed thereon as in the First embodiment. After that, the bonding layer G1 is applied or formed in any other process on the inner face of the sheet 100' and the ornamental layer 200.

Also prepared are the touch sensor 400, with the connecting part 500" connected thereto, and the engaging part 700. After that, the first end 510" of the connecting part 500' is inserted into the receiving hole of the engaging part 700. The connecting part 500" is thus engaged with one of the engaging pieces 710 of the engaging part 700. Then, an adhesive layer G2 is applied or formed in any other process on the touch sensor 400. After that, the touch sensor 400 is placed on and along the inner face of the sheet 100' and the ornamental layer 200. At the same time, the engaging part 700 is mounted at a predetermined position (the position corresponding to the first opening 320" of the plastic part 300") on the ornamental layer 200. As a result, the touch sensor 400 is fixed to the inner face of the sheet 100' and the ornamental layer 200 with the bonding layer G1 and the adhesive layer G2. The engaging part 700 is also fixed to the ornamental layer 200 with the bonding layer G1.

After that, the sheet 100' with the ornamental layer 200, the touch sensor 400, the connecting part 500", and the engaging part 700 are placed in a first mold (not shown), onto which the outer face of the sheet 100' is fixed. Then, the first mold is combined with a second mold (not shown). Then, a convex portion of the second mold comes into contact with the central portion of the engaging part 700. Also, the about half of the connecting part 500" on the first end 510" side is received in a recess formed in the convex portion, or alternatively, the convex portion comes into contact with the about half of the connecting part 500" on the first end 510" side. In this state, thermosoftening or thermosetting plastic is poured into the first and second molds to insert mold the touch sensor 400, the about half of the connecting part 500" on the second end 520" side, and the periphery of the engaging part 700 in the thermosoftening or thermosetting plastic. The hardened thermosoftening or thermosetting plastic forms the plastic part 300". Thus embedded by insert molding in the plastic part 300" are: the touch sensor 400 as placed on the sheet 100', the about half of the connecting part 500" on the second end 520" side as connected to the touch sensor 400, and the periphery of the engaging part 700. This insert molding process also forms the first opening 320" of the plastic part 300", conforming to the convex portion of the second mold, and the plurality of ribbed parts 310" of the plastic part 300" from the thermosoftening or thermosetting plastic entered in a plurality of recesses of the second mold. The sheet 100' is brought into close contact with or integrated with the plastic part 300", and it hardens. After that, the first and second molds are removed. Then, the central portion of the engaging part 700 and the about half of the connecting part 500" on the first end 510" side are exposed from the first opening 320" to the outside of the plastic part 300".

The device module thus manufactured may be installed in electronic equipment in the following manner. First, the first end 510" of the connecting part 500' is connected to a connector C' on the circuit board PB of the electronic equipment as shown in FIG. 5B. In other words, the first end 510" serves as the external connecting portion. The thus connected device module is fixed to the circuit board PB of the electronic equipment with a screw or other means. At the same time, the ribbed parts 310" are engaged with the housing or the circuit board PB of the electronic equipment. The device module is thus mounted on the electronic equipment.

The above device module produces effects similar to those in the First embodiment. Moreover, the connecting part 500", although flexible, is engaged with the engaging part 700 disposed in the first opening 320" of the plastic part 300". As there is no need to fix the position of the connecting part 500" in the mold during the insert molding, it is possible to improve the efficiency of the insert molding process.

Generally speaking, in the case where a sheet has flexibility when molding the plastic part, providing an opening in the plastic part tends to cause the sheet to have a sink mark at a portion exposed from the opening, cause light leaks from the opening of the plastic part, and/or cause the plastic part to decrease in strength due to its reduced thickness. However, in the present device module, the first opening 320" for leading out the connecting part 500" is formed in the plastic part 300" so as to expose the central area of the engaging part 700 fixed to the sheet 100'. In other words, the engaging part 700 in contact with the sheet 100' is embedded below the first opening 320" of the plastic part 300". Therefore, the sheet 100' is less likely to have a sink mark when molding the plastic part 300", and the plastic part 300" is less likely to suffer from light leaks from its first opening 320" or decreased strength due to its reduced thickness.

Fourth Embodiment

Figure 6:
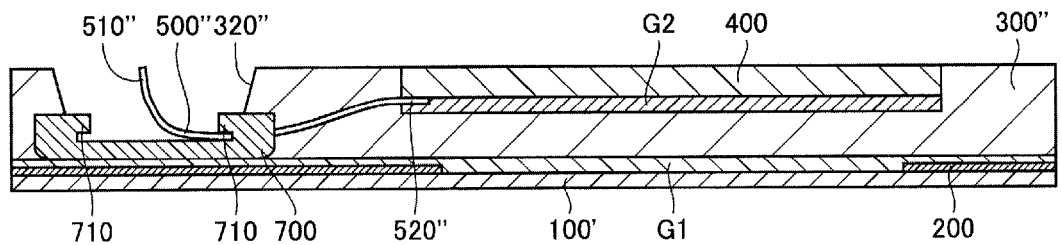
FIG. 6 is a schematic partial end view of a device module in accordance with the Fourth embodiment of the invention

Next, a device module in accordance with the Fourth embodiment will be described with reference to FIG. 6. The device module shown in FIG. 6 has substantially the same configuration as that of the Third embodiment, except that the touch sensor 400 is embedded in the plastic part 300" in spaced relation to the sheet 100'. This difference will be described below in detail, but redundant descriptions will be omitted. Constituents of the present device module are given the same reference numerals as those for the Third embodiment because only the embedding position of the touch sensor 400 is changed as described above.

The touch sensor 400 has the same configuration as that of the First embodiment. The touch sensor 400 is embedded in the central area of the plastic part 300" such that the touch sensor 400 extends substantially parallel to the outer face (lower face in the figure) of the sheet 100', and that the back face (upper face in the figure) of the touch sensor 400 is flush with the back face (upper face in the figure) of the plastic part 300". That is, there is a clearance between the touch sensor 400 and the sheet 100', and there is a constant distance between the touch sensor 400 and the outer face (the touch sensing surface) of the sheet 100'. The adhesive layer G2 is attached to a front face (lower face in the figure) of the touch sensor 400. The adhesive layer G2 improves adhesiveness between the touch sensor 400 and the plastic part 300".

The device module configured as described above may be manufactured in the following steps. First, as in the First embodiment, the sheet 100' formed with the ornamental layer 200 is prepared. After that, a bonding layer G1 is applied or formed in any other process on the inner face of the sheet 100' and the ornamental layer 200.

Also prepared are the touch sensor 400, with a connecting part 500" connected thereto, and an engaging part 700. After that, a first end 510" of the connecting part 500" is inserted into a receiving hole of the engaging part 700. This insertion causes the connecting part 500" to be engaged with one of the engaging pieces 710 of the engaging part 700. After that, the engaging part 700 is mounted at a predetermined position (the position corresponding to a first opening 320" of the plastic part 300") on the ornamental layer 200. As a result, the engaging part 700 is fixed to the ornamental layer 200 with the bonding layer G1. After that, the adhesive layer G2 is applied or formed in any other process on the touch sensor 400.

After that, the sheet 100' with the ornamental layer 200, the connecting part 500", and the engaging part 700 are placed in a first mold (not shown), onto which the outer face of the sheet 100' is fixed. The touch sensor 400 is fixed to a second mold (not shown). The first mold is then combined with the second mold. Then, a convex portion of the second mold comes into contact with the central portion of the engaging part 700. Also, an about half of the connecting part 500" on the first end 510" side is received in a recess formed in the convex portion, or alternatively, the convex portion comes into contact with the about half of the connecting part 500" on the first end 510" side. In this state, thermosoftening or thermosetting plastic is poured into the first and second molds to insert mold the touch sensor 400, the about half of the connecting part 500" on the second end 520" side, and the periphery of the engaging part 700 in the thermosoftening or thermosetting plastic. The hardened thermosoftening or thermosetting plastic forms the plastic part 300". Thus embedded by insert molding in the plastic part 300" are: the touch sensor 400 in spaced relation to and substantially in parallel to the sheet 100', the about half of the connecting part 500" on the second end 520" side as connected to the touch sensor 400, and the periphery of the engaging part 700. This insert molding process also forms the first opening 320" of the plastic part 300", conforming to the convex portion of the second mold, and the plurality of ribbed parts of the plastic part 300" from the thermosoftening or thermosetting plastic entered in a plurality of recesses of the second mold. The sheet 100' is brought into close contact with or integrated with the plastic part 300", and it hardens. After that, the first and second molds are removed. Then, the central portion of the engaging part 700 and the about half of the connecting part 500' on the first end 510" side are exposed from the first opening 320" to the outside of the plastic part 300".

The device module thus manufactured may be installed in electronic equipment in a similar manner to the Third embodiment. The device module produces effects similar to those in the Third embodiment. Moreover, the touch sensor 400 is embedded in the plastic part 300" in spaced relation to the sheet 100'. It is therefore easy to dispose the touch sensor 400 at an appropriate position to provide the best sensitivity.

Fifth Embodiment

Figure 7:
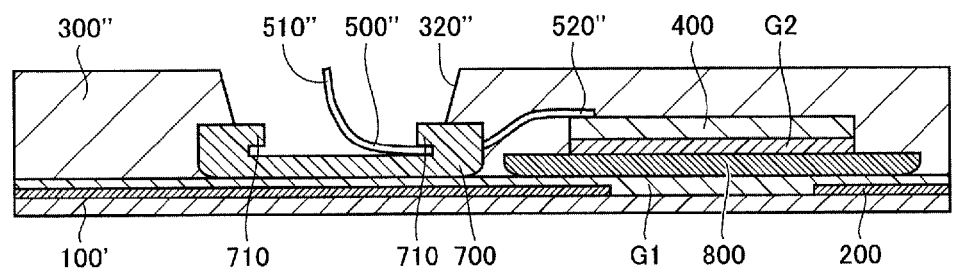
FIG. 7 is a schematic partial end view of a device module in accordance with the Fifth embodiment of the invention.

Next, a device module in accordance with the Fifth embodiment will be described with reference to FIG. 7 and FIG. 8. The device module shown in FIG. 7 has the substantially same configuration as that of the Third embodiment, except that a spacer 800 is additionally provided between a sheet 100' and a touch sensor 400. Only this difference will be described below in detail, and redundant description will be omitted. Constituents of the present device module are given the same reference numerals as those for the Third embodiment because the difference is the additionally provided spacer 800 only.

The spacer 800 is a substantially rectangular transparent plate formed of insulating plastic, elastomer, adhesive such as hot-melt adhesive and OCA (Optically Clear Adhesive), or a double-faced adhesive tape. The spacer 800 has a larger length than the touch sensor 400 and has a larger width than the touch sensor 400. The spacer 800 is fixed on a transparent window W of the sheet 100' and an inner periphery of an ornamental layer 200 with a bonding layer G1 (that is, the spacer 800 is disposed on and along the transparent window W of the sheet 100' and the inner periphery of the ornamental layer 200).

Figure 8:
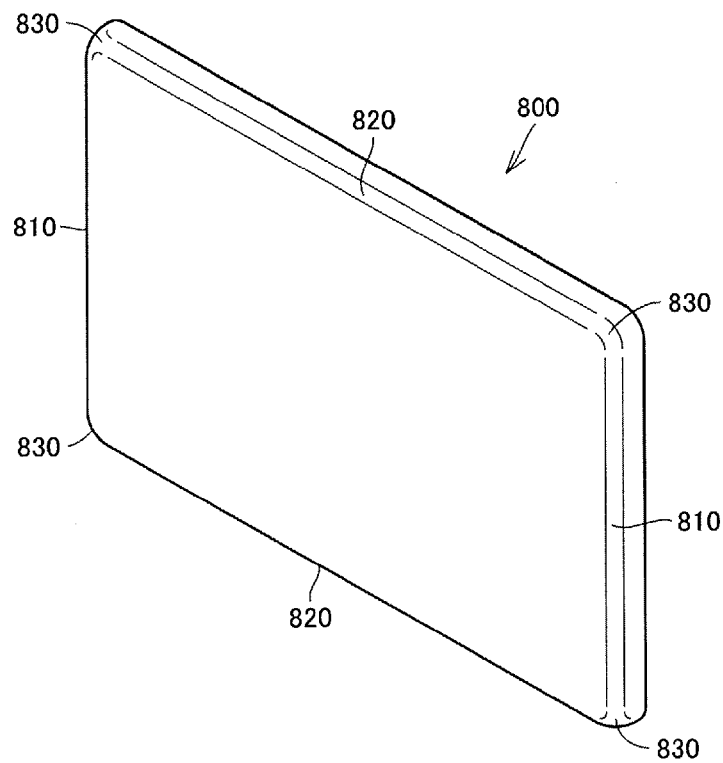
FIG. 8 is a schematic front, bottom, and right side perspective view of a spacer of the device module.

As shown in FIG. 8, the spacer 800 has curved (rounded) edges on the side of the sheet 100', namely edges 810 at opposite longitudinal ends, edges 820 at opposite widthwise ends, and four corner edges 830. All of the edges 810, 820, and 830 are curved to prevent the outer shape of the spacer 800 from appearing as irregularities on the outer face of the sheet 100' having flexibility when forming the plastic part 300".

The touch sensor 400 is fixed to the spacer 800 with an adhesive layer G2. The spacer 800 is disposed on the sheet 100' and the touch sensor 400 is disposed on the spacer 800 (the sheet 100', the spacer 800, and the touch sensor 400 are stacked in this order). The touch sensor 400 and the spacer 800 in the stacked state are embedded in the plastic part 300".

The device module configured as described above may be manufactured in the following steps. First, as in the First embodiment, the sheet 100' formed with an ornamental layer 200 is prepared. After that, a bonding layer G1 is applied or formed in any other process on the inner face of the sheet 100' and the ornamental layer 200. The spacer 800 is also prepared. The spacer 800 is mounted on the inner face of the sheet 100' and the ornamental layer 200 so as to be fixed to the inner face of the sheet 100' and the ornamental layer 200 with the bonding layer G1.

Also prepared are the touch sensor 400, with a second end 520" of a connecting part 500" connected thereto, and an engaging part 700. After that, a first end 510" of the connecting part 500" is inserted into a receiving hole of the engaging part 700. This insertion causes the connecting part 500" to be engaged with one of the engaging pieces 710 of the engaging part 700. After that, an adhesive layer G2 is applied or formed in any other process on the touch sensor 400. The touch sensor 400 is then mounted on the spacer 800, and the engaging part 700 is mounted at a predetermined position (the position corresponding to a first opening 320" of the plastic part 300") on the ornamental layer 200. As a result, the touch sensor 400 is fixed to the spacer 800 with the adhesive layer G2. The engaging part 700 is fixed to the ornamental layer 200 with the bonding layer G1.

After that, the sheet 100' with the ornamental layer 200, the spacer 800, the touch sensor 400, the connecting part 500", and the engaging part 700 are placed in a first mold (not shown), onto which the outer face of the sheet 100' is fixed. Then, the first mold is combined with a second mold (not shown). Then, a convex portion of the second mold comes into contact with the central portion of the engaging part 700. Also, an about half of the connecting part 500" on the first end 510" side is received in a recess formed in the convex portion, or alternatively, the convex portion comes into contact with the about half of the connecting part 500" on the first end 510" side. In this state, thermosoftening or thermosetting plastic is poured into the first and second molds to insert mold the spacer 800, the touch sensor 400, the about half of the connecting part 500" on the second end 520" side, and the periphery of the engaging part 700 in the thermosoftening or thermosetting plastic. The hardened thermosoftening or thermosetting plastic forms the plastic part 300". Thus embedded by insert molding in the plastic part 300" are: the spacer 800 and the touch sensor 400 disposed thereon, the about half of the connecting part 500" on the second end 520" side as connected to the touch sensor 400, and the periphery of the engaging part 700. This insert molding process also forms the first opening 320" of the plastic part 300", conforming to the convex portion of the second mold, and a plurality of ribbed parts of the plastic part 300" from the thermosoftening or thermosetting plastic entered in a plurality of recesses of the second mold. The sheet 100' brought into close contact with or integrated with the plastic part 300", and it hardens. After that, the first and second molds are removed. Then, the central portion of the engaging part 700 and the about half of the connecting part 500" on the first end 510" side are exposed from the opening 320" of the plastic part 300" to the outside of the plastic part 300".

The device module thus manufactured may be installed in electronic equipment in a similar manner to the Third embodiment. The device module produces effects similar to those in the Third embodiment. Moreover, the spacer 800 is interposed between the touch sensor 400 and the sheet 100'. The thickness of the spacer 800 can be determined so as to optimize the sensitivity of the touch sensor 400. It is therefore easy to dispose the touch sensor 400 at an appropriate position to provide the best sensitivity.

Sixth Embodiment

Figure 9:
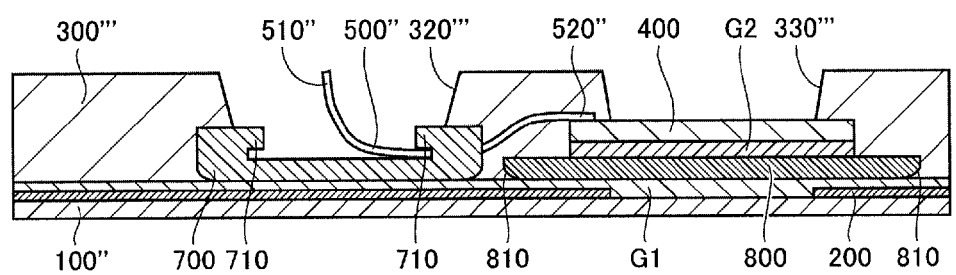
FIG. 9 is a schematic partial end view of a device module in accordance with the Sixth embodiment of the invention.

Next, a device module in accordance with the Sixth embodiment will be described with reference to FIG. 9. The device module shown in FIG. 9 has the substantially same configuration as that of the Fifth embodiment, except that a plastic part 300''' has an additional opening, namely a second opening 330'''. Only this difference will be described below in detail, and redundant descriptions will be omitted. A symbol _'''_ is added to the reference numerals of the plastic part and its subcomponents to distinguish them from those of the Third embodiment. A symbol _"_ is added to the reference numeral of the sheet to distinguish it from that of the Fifth embodiment.

The second opening 330''' of the plastic part 300''' is formed on the back side of the touch sensor 400 (on the opposite side from a spacer 800) so as to expose a central portion of the touch sensor 400.

The spacer 800 as disposed on the sheet 100" is embedded in the plastic part 300'''. The touch sensor 400 is disposed on the spacer 800 and its periphery is embedded in the plastic part 300'''.

The device module configured as described above may be manufactured in the following steps. The manufacturing steps are the same as those in the Fifth embodiment until the spacer 800 and the touch sensor 400 are stacked in this order on the inner face of the sheet 100" and the ornamental layer 200, and the engaging part 700 is fixed to the ornamental layer 200.

The next step is to place the sheet 100" with the ornamental layer 200, the spacer 800, the touch sensor 400, the connecting part 500", and the engaging part 700 in a first mold (not shown) and fix the outer face of the sheet 100" to the first mold. The first mold is then combined with a second mold (not shown). Then, a first convex portion of the second mold comes into contact with the central portion of the engaging part 700, and a second convex portion of the second mold comes into contact with the central portion of the touch sensor 400. Also, an about half of the connecting part 500" on the first end 510" side is received in a recess formed in the first convex portion, or alternatively, the first convex portion comes into contact with the about half of the connecting part 500" on the first end 510" side. In this state, thermosoftening or thermosetting plastic is poured into the first and second molds to insert mold the spacer 800, the periphery of the touch sensor 400, the about half of the connecting part 500" on the second end 520" side, and the periphery of the engaging part 700 in the thermosoftening or thermosetting plastic. The hardened thermosoftening or thermosetting plastic forms the plastic part 300". The spacer 800 and the periphery of the touch sensor 400 are thus embedded in the plastic part 300''', with the spacer 800 disposed on the sheet 100" and the touch sensor 400 disposed on the spacer 800. Also embedded in the plastic part 300''' are: the about half of the connecting part 500" on the second end 520" side as connected to the touch sensor 400, and the periphery of the engaging part 700. This insert molding process also forms a first opening 320''' of the plastic part 300''' conforming to the first convex portion of the second mold, the second opening 330''' of the plastic part 300''' conforming to the second convex portion of the second mold, and a plurality of ribbed parts of the plastic part 300' from the thermosoftening or thermosetting plastic entered in a plurality of recesses of the second mold. The sheet 100" is brought into close contact with or integrated with the plastic part 300''', and it hardens. After that, the first and second molds are removed. Then, the central portion of the engaging part 700 and the about half of the connecting part 500" on the first end 510" side are exposed from the first opening 320' to the outside of the plastic part 300", and the central part of the touch sensor 400 is exposed from the second opening 330'''.

The device module thus manufactured may be installed in electronic equipment in a similar manner to the Fifth embodiment. The device module produces effects similar to those in the Fifth embodiment. Moreover, since the second opening 330''' of the plastic part 300''' is formed on the back side of the touch sensor 400, it is possible to reduce the amount of plastic for the plastic part 300''' and improve the transmittance of the portion of the plastic part 300''' corresponding to the touch sensor 400.

Generally speaking, in the case where a sheet has flexibility when molding the plastic part, providing an opening in the plastic part tends to cause the sheet to have a sink mark at a portion exposed from the opening, cause light leaks from the opening of the plastic part, and/or cause the plastic part to decrease in strength due to its reduced thickness. However, in the present device module, the second opening 330''' is formed in the plastic part 300''' so as to expose the central portion of the touch sensor 400. In other words, the spacer 800 as disposed on the sheet 100 and the touch sensor 400 as disposed on the spacer 800 are embedded below the second opening 300''' of the plastic part 300'''. Therefore, the sheet 100 is less likely to have a sink mark when molding the plastic part 300''', and the plastic part 300''' is less likely to suffer from light leaks from its second opening 300''' or decreased strength due to its reduced thickness.

The device module of the invention is not limited to the embodiments and may be modified within the scope of claims. Specific modifications will be described below.

Figure 10A:
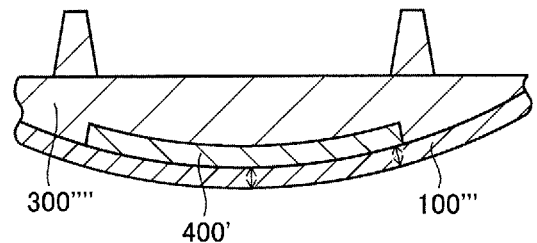
FIG. 10A is a schematic partial end view of a first modification of the device module in accordance with the Third embodiment of the invention.
Figure 10B:
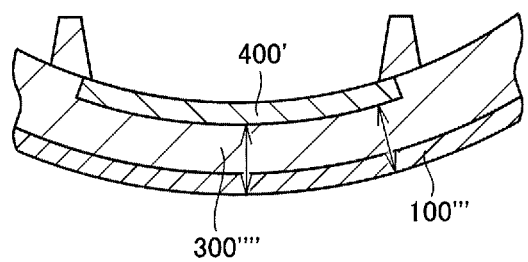
FIG. 10B is a schematic partial end view of a first modification of the device module in accordance with the Fourth embodiment of the invention.
Figure 10C:
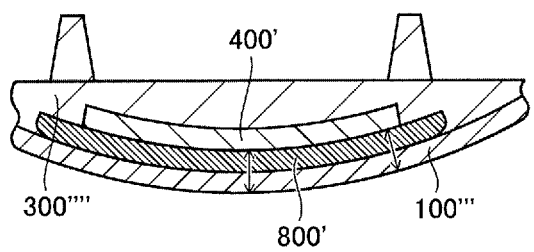
FIG. 10C is a schematic partial end view of a first modification of the device module in accordance with the Fifth embodiment of the invention.

In the First to Sixth embodiments, the plastic part maintains the touch sensing surface of the sheet in a flat state. FIG. 10A to FIG. 10C each illustrate a modified plastic part 300'''', which is curved so as to maintain a touch sensing surface of a sheet 100''' in a curved form. In any of these illustrated modifications, the plastic part 300'''' may have a touch sensor 400' embedded therein in a curved form such that the distance between the touch sensor 400' and the touch sensing surface of the sheet 100''' is generally constant.

More specifically, the touch sensor 400' shown in FIG. 10A is disposed on an inner face of the sheet 100''' and embedded in the plastic part 300'''' in curved form such that the distance between the touch sensor 400' and the touch sensing surface of the sheet 100''' is generally constant. The touch sensor 400' shown in FIG. 10B is embedded in the plastic part 300'''' in curved form and in spaced relation to the sheet 100''' such that the distance between the touch sensor 400' and the touch sensing surface of the sheet 100''' is generally constant. The touch sensor 400' shown in FIG. 10C is disposed on the spacer 700' and is embedded in curved form together with the spacer 700' in the plastic part 300'''' such that the distance between the touch sensor 400' and the touch sensing surface of the sheet 100''' is generally constant. The spacer 700' is in curved form conforming to the touch sensing surface. In any of these modified device modules, the touch sensor is embedded in the plastic part in curved form such that the distance between the touch sensor and the touch sensing surface (that is, the outer face of the sheet) is generally constant. It is therefore possible to keep the sensitivity of the touch sensor generally constant in the whole area. In other words, it is possible to prevent variations in sensitivity of the touch sensor between different areas (for example, between a central area and a peripheral area) due to varying distances from the touch sensor to the touch sensing surface (the outer face of the sheet). FIG. 10A to FIG. 10C do not show the ornamental layer, the connecting part, the bonding layer, the adhesive layer, the engaging part (or the reinforcing part), or the first opening of the plastic part, but any of these components with the same configurations as those in the First to Sixth embodiments may be included in any of these modified device module.

The device of the invention may be a touch sensor, more particularly a capacitive touch panel as described above. The device may also be any type of sensor, any type of electronic component, or any type of circuit board. In other words, the device module of the invention may be configured such that, in place of a sensor, an electronic component or a circuit board is embedded in the plastic part. The sensor may be of any type including a touch panel of any other type (for example, resistive film-type, optical-type, ultrasonic-type, or in-cell type), a touch switch (for example, a touch switch of capacitive, resistive film-type, optical-type, ultrasonic-type, or in-cell type), or a sensor of any other type than the touch panel and the touch switch (for example, a magnetic sensor, an optical sensor, or a light-dark sensor). The touch panel and the touch switch (touch sensor) may have electrodes on a sheet formed by any known printing method. Further, the touch sensor may be optically opaque. The touch sensing surface of the touch panel/the touch switch may or may not be the outer face of the sheet. For example, the touch sensing surface may be an outer face of a panel provided on the outer side of the sheet. The electronic component may be an active device such as a semiconductor or may be a passive device such as a resistor, a capacitor, and a coil.

The plastic part 300 of the First embodiment includes the ribbed parts 310 and the first opening 320. The plastic part 300' of the Second embodiment includes the ribbed parts 310' and the plurality of first openings 320'. The plastic part 300" of the Third to Fifth embodiments includes the ribbed parts 310" and the first opening 320". The plastic part 300'" of the Sixth embodiment includes the ribbed parts, the first opening 320'", and the second opening 330'". However, the plastic part of the invention may be of any configuration adapted to be embedded with the device and the connecting part and to have the first opening to expose at least the external connecting portion of the connecting part to the outside. It is therefore possible to omit the second opening.

The second opening described above is provided in the plastic part to expose the central portion of the touch sensor 400. The second opening of the invention may be provided at any part of the plastic part that is on the opposite side of the device from the sheet or the spacer. For example, if the device in contact with or in spaced relation to the sheet is embedded in the plastic part, the plastic part may have a second opening to expose a part of the device on the side opposite from the sheet. Alternatively, the second opening of the plastic part may be provided on the opposite side of the device from the sheet or the spacer so as not to expose a part of the device on the side opposite from the sheet. That is, the second opening may be a recess not to allow the exposure of a part of the device. In any of the above cases, the provision of the second opening in the plastic part is advantageous because of reduced amount of plastic required. Also, the provision of the second opening in the plastic part is advantageous also in the case where both the sheet and the plastic part have translucency. Since the portion of the plastic part having the second opening is thin-walled, the plastic part has a better transmittance at the thin-walled portion. The plastic part shown in FIG. 10A to 10C may have any of the above-mentioned second opening.

The plastic part of the invention may be modified like a plastic part 300"" as shown in FIG. 10A and FIG. 10C, including a sheet contacting face in curved form and a back face in flat form on the opposite side from the sheet contact face. FIG. 10B illustrates an alternative plastic part 300"" including a sheet contacting face in curved form and a back face in curved form on the opposite side from the sheet contact face. The plastic part 300"" shown in FIG. 10A and FIG. 10C and the plastic part in the above embodiment may be modified to include a back face in curved form. The plastic part 300"" shown in FIG. 10B may also be modified to have a back face in flat form. The plastic part may be formed without the ribbed parts in the case where the plastic part is stably disposed to oppose to the circuit board PB by fixing the device module to the circuit board PB of the electronic equipment with a screw or by other means. By "curved" used herein is meant any nonflat surfaces including spherical. The sheet contact face and/or the back face of the plastic part may be in any curved form.

The connecting part described above may be a flexible printed circuit board or a flexible sheet as described above. However, the connecting part of the invention may be modified in any manner as long as it is adapted to be embedded at least partially in the plastic part as connected to the device, and as long as it includes an external connecting portion exposed from the first opening of the plastic part to the outside. For example, the connecting part may be a rigid circuit board. Further, the connecting part may have a conducting line provided on the sheet for connecting the device to the external connecting portion. The connecting part may also be a lead wire.

Figure 12:
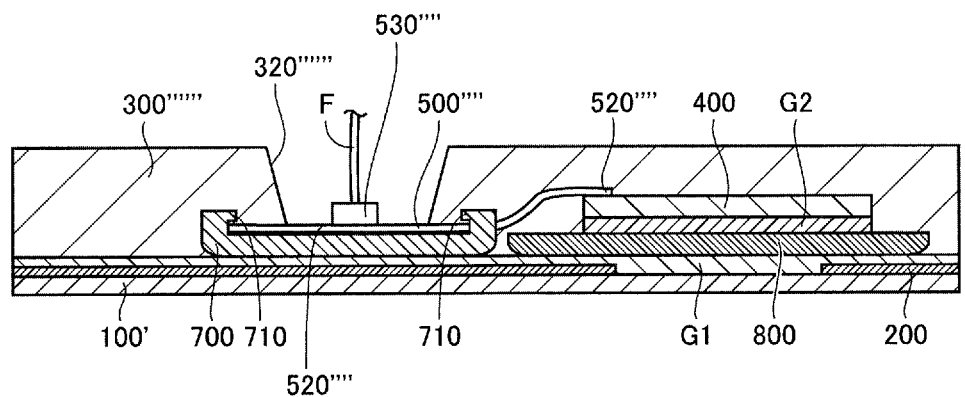
FIG. 12 is a schematic partial end view of a second modification of the device module in accordance with the Fifth embodiment of the invention.

The external connecting portion may be a connector, a contact, an electrode, or the first end of the connecting part as described above. The external connecting portion may be modified as long as it is exposed from the first opening of the plastic part and connectable to the outside of the device module. For example, in the Third to Sixth embodiments, the first end 510" of the connecting part 500' may be provided with an external connecting portion such as a connector, a header pin, contact, or an electrode. FIG. 12 illustrates a modified device module. More particularly, a first end 510"" of a connecting part 500"" is engaged with a pair of engaging pieces 710 of the engaging part 700. An external connecting portions 530"" is provided on the first end 510'" and exposed from a first opening 320"'" of a plastic part 300"'". The external connecting portions 530"" may be a connector, in which case the connector may be connected to a flexible printed board F (as shown in FIG. 12) or a B to B connector (not shown) that is connected to a circuit board of electronic equipment.

Figure 11:
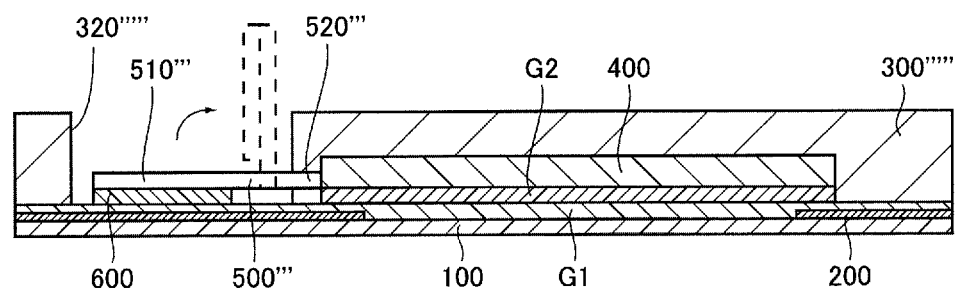
FIG. 11 is a schematic partial end view of a first modification of the device module in accordance with the First embodiment of the invention.

The reinforcing part 600 of the First and Second embodiments is fixed to the face opposed to the sheet of the first end of the connecting part and is in contact with the sheet 100 with the ornamental layer 200 interposed therebetween. However, the reinforcing part of the invention may be modified as long as it is fixed to the first end of the connecting part. FIG. 11 illustrates a modified device module having a connecting part 500'" bendable generally in L shape. In this case, the reinforcing part 600 may not be in contact with the sheet 100 when the connecting part 500'" is connected to the outside. Further, the reinforcing part may be visually transparent. It is possible to appropriately select the outer shape and/or material of the reinforcing part, which hardly causes irregularities of the sheet having flexibility due to its outer shape when molding the plastic part. For example, the reinforcing part may have all of the edges on the side of the sheet in curved forms, or may be made of material in the same group as that of the material for the sheet (for example, plastic material in the same group as that of the material for the sheet: e.g. polycarbonate (PC) or polymethylmethacrylate (PMMA) corresponding to the sheet 100 of the above embodiments). The reinforcing part may also be made of an elastic material.

The engaging part described above is configured such that as engaged with the connecting part, its periphery is embedded in the plastic part, and its central portion is exposed from the first opening of the plastic part. However, the engaging part of the invention may be modified in any manner as long as it is partially embedded in the plastic part and engageable with the connecting part. For example, the engaging part may be modified so as not to be in contact with the sheet. The engaging part 700 of the Third to Sixth embodiments has the pair of engaging pieces 710, one of which is engaged with the connecting part 500". Alternatively, as shown in FIG. 12, a first end 510"" of a connecting part 500"" can be engaged with both of the pair of engaging pieces 710 of the engaging part 700. The engaging part may be visually transparent. The engaging part may have at least one part to engage with the connecting part, such as an engaging hole, an engaging recess, and an engaging piece. It is possible to appropriately select the outer shape and/or material of the engaging part, which hardly causes irregularities of the sheet having flexibility due to its outer shape when molding the plastic part. For example, the engaging part may have all of the edges on the side of the sheet in curved forms or may be made of material in the same group as that of the material for the sheet (for example, plastic material in the same group as that of the material for the sheet: e.g. polycarbonate (PC) or polymethylmethacrylate (PMMA) corresponding to the sheet 100 of the above embodiments). The engaging part may also be made of an elastic material.

The spacer may be any member to be embedded in the plastic part so as to be interposed between the sheet and the device. For example, in the case where the sheet is optically opaque, the spacer may be made of metal such as SUS. The spacer may have all of the edges on the side of the sheet in curved form. However, the spacer is not limited to this. It is possible to appropriately select the outer shape and/or material of the spacer, which hardly causes irregularities on a flexible sheet when molding of the plastic part. For example, all of the edges of the spacer on the side of the sheet may be in curved form, or the spacer may be made of made of material in the same group as that of the material for the sheet (for example, plastic material in the same group as that of the material for the sheet: e.g. polycarbonate (PC) or polymethylmethacrylate (PMMA) corresponding to the sheet 100 of the above embodiments). The spacer may also be made of an elastic material. In the case where the spacer is of a circular disc shape, the ring-shaped edge of the outer periphery of the spacer may be in curved form on the side of the sheet. In the case where the spacer is a polygonal plate, all edges on the side of the sheet may be in curved form. Further, the spacer may be integrated with the reinforcing part.

The sheet described above may be omitted. In other words, the device module of the invention may include the plastic part, the device, which is embedded in the plastic part, and the connecting part. The sheet may be visually transparent and flexible as described above, but it is not limited to this. The sheet may be configured to be translucent and flexible, or optically opaque and flexible, or translucent and nonflexible, or optically opaque and nonflexible. Further, the sheet may be made of a material that will not harden (will not lose its flexibility) after molding the plastic part. The ornamental layer may be provided on the inner face of the sheet as described above or may be omitted. Further, the ornamental layer may be formed entirely on the inner face of the sheet to make the sheet opaque. The bonding layer G1 and/or the adhesive layer G2 may be omitted.

The device modules of the Third to Sixth embodiments may be manufactured in the methods as described above or in any other manner. For example, a device module with no sheet may be fabricated in the following manner. First, prepared is the device, to which the connecting part is connected. Also prepared is the engaging part engaged with the connecting part or the reinforcing part fixed to the connecting part. The device is then fixed to a first mold, while the engaging part or reinforcing part is fixed to the first mold or a second mold. The first and second molds are then combined with each other, thereby brining a convex portion of the second or first mold into abutment with the engaging part or connecting part. Plastic is poured into the first and second molds, and the first and second molds are removed later. This is a series of steps to obtain a device module with no sheet. The first or second mold may have a movable part that can be nested and function as the convex portion. In this case, the movable part may be brought into contact with the engaging part after combining the first and second molds.

Described below is an example of a series of steps to obtain a device module with one of the device and the engaging part not fixed to the sheet, or with one of the device and the reinforcing part not fixed to the sheet. First, prepared is a device, to which the connecting part is connected. Also prepared is the engaging part engaged with the connecting part or the reinforcing part fixed to the connecting part. After that, one of the device and the engaging part, or one of the device and the reinforcing part is fixed to the sheet. The sheet is then fixed to a first mold, while the other one of the device and the engaging part, or the other one of the device and the reinforcing part is fixed to a second mold. Then, the first and second molds are combined with each other, thereby brining a convex portion of the first or second mold into contact with the engaging part or connecting part. Plastic is poured into the first and second molds, and the first and second molds are removed later. This is a series of steps to obtain a device module with one of the device and the engaging part not fixed to the sheet, or with one of the device and the reinforcing part not fixed to the sheet. The first or second mold may have a movable part that can be nested and functions as the convex portion. In this case, the movable part may be brought into contact with the engaging part or connecting part after combining the first and second molds. Also, the second mold to be used in the Third to Sixth embodiments may have a movable part that can be nested and function as the convex portion. In this case, the movable part may be brought into contact with the engaging part after combining the first and second molds.

In any of the manufacturing methods of the device module described above, instead of fixing the device to the sheet, it is possible to fix the spacer to the sheet and the device to the spacer. As described above, it is possible to prepare a sheet with or without the ornamental layer formed thereon. Also, when the convex portion of the second or first mold is brought into contact with the engaging part or reinforcing part, the convex portion may be brought into contact with a part of the connecting part. In this case, this part of the connecting part is exposed from the first opening of the plastic part. Alternatively, when the convex portion of the second or first mold is brought into contact with the engaging part, a part of the connecting part may be received in a recess provided in the convex portion of the second or first mold.

It should be appreciated that the above-described preferred embodiments and modifications are described by way of examples only. The material, shape, dimensions, number, arrangement, and other features of each constituent element of the device module may be modified as long as they provide the same functions. At least one of the sheet, the plastic part, and the spacer may have translucency. The circuit board PB may be provided with, in place of the display such as an LCD, an illumination part such as a LED (light emitting diode) or an EL (electro-luminescence) device.

REFERENCE SIGNS LIST

100: sheet
100': sheet
100": sheet
200: ornamental layer
300: plastic part
   310: ribbed part
   320: first opening
300': plastic part
   310': ribbed part
   320': first opening
300": plastic part
   310": ribbed part
   320": first opening
300''': plastic part
   320''': ribbed part
   330''': first opening
400: touch sensor (device)
500: connecting part 510: first end
520: second end
500': connecting part
510': first end
520': second end
500": connecting part
510": first end
520": second end
600: reinforcing part
700: engaging part
710: engaging piece
800: spacer
810: edge (edge on the side of the sheet)
820: edge (edge on the side of the sheet)
830: edge (edge on the side of the sheet)

The invention claimed is:

1. A device module comprising:
a device being a sensor;
an external connecting portion;
a connecting part connected to the device and provided with the external connecting portion; and
a plastic part molded of plastic material, the device and the connecting part being insert-molded in the plastic part, the plastic part being provided with a first opening that exposes at least the external connecting portion of the connecting part to the outside,
wherein the connecting part is a flexible printed circuit board or flexible insulating film,
wherein the connecting part has a substantially uniform thickness.

2. The device module in accordance with claim 1, wherein the connecting part includes a first end serving as the external connecting portion.

3. The device module in accordance with claim 1, wherein the connecting part includes a first end exposed from the first opening, and
a tip of the first end is insert-molded in the plastic part.

4. The device module in accordance with claim 2, further comprising an engaging part, the engaging part being partially insert-molded in the plastic part, partially exposed from the first opening of the plastic part, and engaged with the connecting part.

5. The device module in accordance with claim 1, further comprising
a sheet,
wherein the plastic part is disposed on the sheet.

6. The device module in accordance with claim 4, further comprising
a sheet, wherein
the plastic part is disposed on the sheet,
the engaging part insert-molded in the plastic part is in contact with the sheet, and
the first opening is provided on an opposite side of the engaging part from the sheet so as to expose the engaging part partially.

7. The device module in accordance with claim 3, further comprising:
a sheet, the plastic part being disposed on the sheet; and
a reinforcing part fixed to the first end of the connecting part, the reinforcing part as contacting the sheet being insert-molded in the plastic part.

8. The device module in accordance with claim 5, wherein at least one of the sheet and the plastic part has translucency.

9. The device module in accordance with claim 6, wherein all edges of the engaging part on a side of the sheet are in curved form.

10. The device module in accordance with claim 7, wherein all edges of the reinforcing part on a side of the sheet are in curved form.

11. The device module in accordance with claim 7, wherein the reinforcing part has elasticity.

12. The device module in accordance with claim 10, wherein
the reinforcing part has elasticity.

13. The device module in accordance with claim 6, further comprising a spacer, wherein
the spacer and the device are insert-molded in the plastic part, with the spacer disposed on the sheet and the device disposed on the spacer.

14. The device module in accordance with claim 7, further comprising a spacer, wherein
the spacer and the device are insert-molded in the plastic part, with the spacer disposed on the sheet and the device disposed on the spacer.

15. The device module in accordance with claim 13, wherein
all edges of the spacer on the side of the sheet are in curved form.

16. The device module in accordance with claim 14, wherein
all edges of the spacer on the side of the sheet are in curved form.

17. The device module in accordance with claim 13, wherein
the spacer is made of material in a same group as that of the material for the sheet or made of an elastic material.

18. The device module in accordance with claim 14, wherein
the spacer is made of material in a same group as that of the material for the sheet or made of an elastic material.

19. The device module in accordance with claim 5, wherein
the plastic part further includes a second opening provided on an opposite side of the device from the sheet.

20. The device module in accordance with claim 13, wherein
at least one of the sheet, the plastic part, and the spacer has translucency.

21. The device module in accordance with claim 14, wherein
at least one of the sheet, the plastic part, and the spacer has translucency.

22. The device module in accordance with claim 5, wherein
the sheet has translucency, and
the device module further includes an ornamental layer interposed between the sheet and the plastic part.

23. The device module in accordance with claim 1, wherein
the sensor is a touch sensor.

24. The device module in accordance with claim 23, wherein
the external connecting portion is a connector, a contact, or an electrode on a face of the flexible printed circuit board or flexible insulating film,
the face of the flexible printed circuit board or flexible insulating film includes an area surrounding the external connecting portion, and
the external connecting portion and the surrounding area are exposed through the first opening of the plastic part to an outside of the plastic part.

25. The device module in accordance with claim 23, wherein
the flexible printed circuit board or flexible insulating film includes an embedded portion and an exposed portion, the embedded portion is connected to the sensor and embedded in the plastic part by insert-molding, and the exposed portion includes the external connecting portion being a first lengthwise end portion of the flexible printed circuit board or flexible insulating film, the exposed portion being exposed through the first opening of the plastic part to an outside of the plastic part.

26. A device module comprising:

a device being an electronic component or a circuit board;

an external connecting portion;

a connecting part connected to the device and provided with the external connecting portion; and a plastic part molded of plastic material, the device and the connecting part being insert-molded in the plastic part, the plastic part being provided with a first opening that exposes at least the external connecting portion of the connecting part to the outside, wherein the connecting part is a flexible printed circuit board or flexible insulating film, wherein the connecting part has a substantially uniform thickness.

27. The device module in accordance with claim 26, wherein the device is the electronic component, the electronic component being an active or passive device.

* * * * *